(12) United States Patent
Crivelli

(10) Patent No.: US 8,590,387 B2
(45) Date of Patent: Nov. 26, 2013

(54) ABSOLUTE CAPACITIVE MICRO PRESSURE SENSOR

(75) Inventor: Rocco Crivelli, Neuchâtel (CH)

(73) Assignee: Depuy Synthes Products, LLC, Raynham, MA (US)

( * ) Notice: Subject to any disclaimer, the term of this patent is extended or adjusted under 35 U.S.C. 154(b) by 442 days.

(21) Appl. No.: 13/076,757

(22) Filed: Mar. 31, 2011

(65) Prior Publication Data
US 2012/0247218 A1 Oct. 4, 2012

(51) Int. Cl.
*G01L 7/08* (2006.01)
*G01L 9/12* (2006.01)
*H01G 7/00* (2006.01)

(52) U.S. Cl.
USPC ............... 73/724; 73/715; 73/718; 73/754; 361/283.4

(58) Field of Classification Search
None
See application file for complete search history.

(56) References Cited

U.S. PATENT DOCUMENTS

| | | | |
|---|---|---|---|
| 4,458,292 A | 7/1984 | Tward et al. | |
| 4,875,134 A | 10/1989 | Kuisma | |
| 5,608,262 A * | 3/1997 | Degani et al. | 257/723 |
| 5,750,899 A | 5/1998 | Hegner et al. | |
| 5,811,684 A * | 9/1998 | Sokn | 73/706 |
| 5,996,419 A * | 12/1999 | Sokn | 73/706 |
| 6,527,744 B1 * | 3/2003 | Kriesel et al. | 604/132 |
| 6,564,642 B1 | 5/2003 | Clifford | |
| 6,640,641 B1 | 11/2003 | Benestad | |
| 6,874,367 B2 | 4/2005 | Jakobsen | |
| 6,936,917 B2 * | 8/2005 | Lopata et al. | 257/704 |
| 6,937,460 B2 * | 8/2005 | Lang | 361/502 |
| 6,992,492 B2 | 1/2006 | Burdick et al. | |
| 7,510,533 B2 | 3/2009 | Mauge et al. | |
| 8,230,743 B2 * | 7/2012 | Wade et al. | 73/706 |
| 2005/0088184 A1 | 4/2005 | Burdick et al. | |
| 2007/0118038 A1 | 5/2007 | Bodecker et al. | |
| 2007/0118039 A1 | 5/2007 | Bodecker et al. | |
| 2008/0214983 A1 | 9/2008 | Mauge et al. | |
| 2009/0156960 A1 | 6/2009 | Mauge et al. | |
| 2009/0246546 A1 | 10/2009 | Keppner et al. | |
| 2011/0038130 A1 | 2/2011 | Hogg et al. | |
| 2011/0039050 A1 | 2/2011 | Hogg et al. | |

FOREIGN PATENT DOCUMENTS

| | | |
|---|---|---|
| JP | 2007139517 | 6/2007 |
| JP | 2009250651 | 10/2009 |
| JP | 2011028476 A * | 2/2011 |

OTHER PUBLICATIONS

European Search Report dated Jul. 2, 2012 in connection with counterpart EP application No. 12162705 (7 pages).

* cited by examiner

*Primary Examiner* — Hezron E Williams
*Assistant Examiner* — Jermaine Jenkins
(74) *Attorney, Agent, or Firm* — Cheryl F. Cohen, LLC

(57) ABSTRACT

An absolute capacitive micro pressure sensor including a pressure sensor element with a mechanically fixed electrode and a deflectable pressure sensor membrane separated from the fixed electrode by a predetermined distance. A packaging defining a chamber is formed by a cover assembled to a base plate with an opening defined therein. The chamber is filed with a fluid and/or a gas at substantially constant pressure. Within, the chamber, the pressure sensor element is mounted to the base plate to define an open cavity therebetween substantially aligned with the opening defined in the base plate. A gel is disposed in the open cavity in contact with an exposed surface of the deflectable membrane.

36 Claims, 8 Drawing Sheets

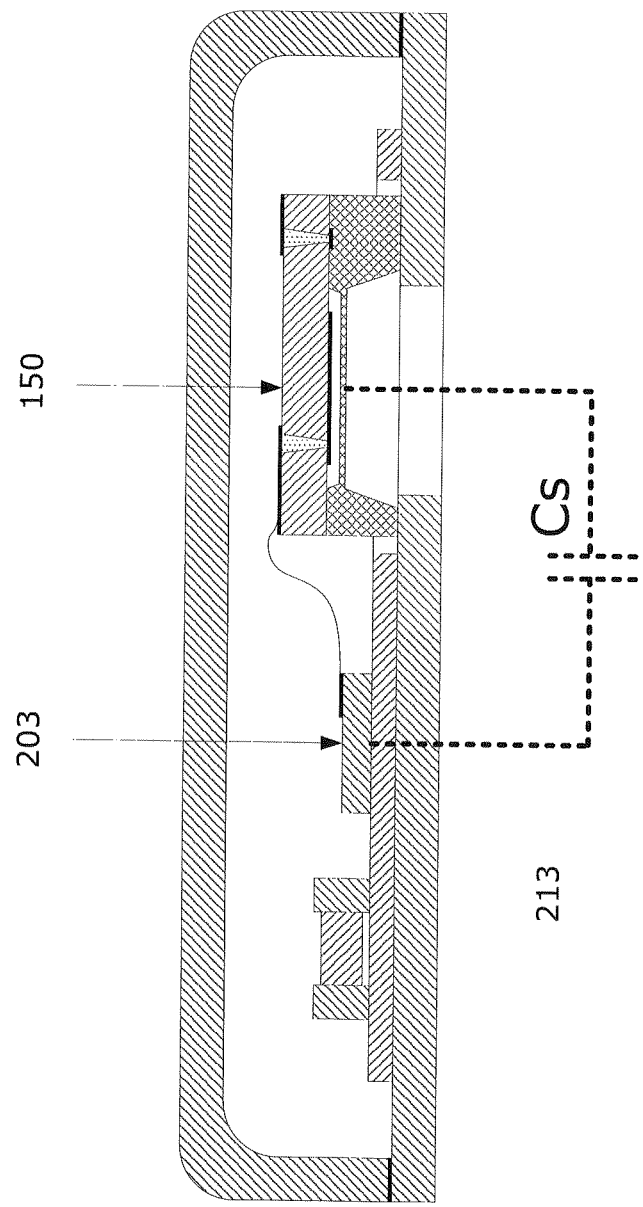

ABSOLUTE CAPACITIVE MICRO PRESSURE SENSOR

BACKGROUND OF THE INVENTION

1. Field of the Invention

The present invention relates to an absolute capacitive micro pressure sensor. More particularly, the invention relates to an absolute capacitive micro pressure sensor or transducer subject to exposure to a fluid such as saline when implanted in the body.

2. Description of Related Art

Monocrystalline silicon absolute capacitive micro pressure sensors comprise a relatively thin silicon membrane that mechanically deflects under pressure. The mechanical deflection is correlated to the pressure to be measured. In order to measure an absolute pressure, the other side of the membrane is exposed to a substantially constant pressure created by a sealed chamber.

Capacitive pressure sensors measure the mechanical deflection by measuring the change of the capacitance constituted by a dielectric region between a pair of electrodes or conductive layers, one being mechanically fixed and the other being deflectable or moveable. FIG. 3 is a graphical representation of capacitance as a function of pressure and thickness of the deflectable membrane of a conventional monocrystalline silicon absolute capacitive pressure sensor. Three exemplary thicknesses of the deflectable membrane (45.8 um, 44.3 um, 42.3 um) are depicted by the dotted, dashed and solid lines, respectively. As is evident from the three curves, the thicker the membrane the less deflection of the membrane for :a given pressure and hence the smaller the variation in capacitance.

FIGS. 1A & 1B depict cross-sectional views of two different prior art absolute capacitive micro pressure sensors or transducers including a pressure sensor element 150 with a semiconductor base element 101 (e.g., silicon) mounted, preferably anodically bonded, at interface 110 to a base plate 100, preferably glass, having a hole or opening 112 defined therethrough. Opening 112 has a diameter in a preferred range between approximately 0.5 mm and approximately 2.5 mm.

Sensor element 150 includes a pair of conductive layers or capacitor electrodes separated from one another by a predetermined distance D therebetween. In particular, the pair of conductive layers or electrodes comprises a first mechanically fixed capacitor electrode 106 mounted to a glass element 102 and a deflectable membrane 111 comprising part of the base element 101 so as to be separated from the electrode 106 by a predetermined distance. In the embodiment shown in FIG. 1A, the deflectable membrane 111 is made from a deflectable conductive material such as doped p+ silicon thereby serving as a second moveable capacitor or conductive layer. In an alternative embodiment shown in FIG. 1B, the deflectable membrane 111 is made from a non-conductive semiconductor material such as silicon and a separate second moveable capacitor electrode 113, for example, a conductive metallic layer, is deposited onto the deflectable membrane 111.

The pressure sensors depicted in FIGS. 1A & 1B both have one or more metalized feed through passages 105, 107 defined through the glass element 102. Despite only two being depicted in each of the figures, more than two feed through passages is contemplated and within the intended scope of the present invention. Each feed through passage is bounded on both sides of the glass element 102 by a metalized area. In particular, metalized feed through passage 105 is bounded on one side of the glass element 102 by fixed capacitor electrode 106 and on its opposing side by metalized area 104, while metalized feed through passage 107 is bounded between metalized areas 108, 109.

Fixed capacitor electrode 106, represented in FIGS. 1A & 1B, is positioned so as to be subject to a substantially constant sensing element reference pressure in a sealed cavity 103, while the deflectable membrane 111 is exposed to a pressure to be measured in open cavity 114. In FIGS. 1A & 1B, reference element Z represents the distance between the deflectable membrane 111 and the bonding interface 110 of the base plate 100, whereas H denotes the thickness of base plate 100 itself.

In operation, as the pressure being measured increases the membrane 111 deflects towards the fixed capacitor electrode 106 thereby reducing the distance D therebetween. The capacitance value of a capacitor formed by the fixed capacitor electrode 106 and the membrane 111 as a result of the reduced distance D is sensed to detect the pressure being measured. On the other hand, as the pressure being measured decreases the membrane 111 deflects away from the fixed capacitor electrode 106 causing the distance D therebetween to increase. As a result of the increased distance D, the capacitance value of the capacitor formed by the two electrodes is sensed to determine the pressure being measured. Similar operation occurs with the alternative embodiment shown in FIG. 1B, the only difference being that the moveable capacitor electrode 113, rather than membrane 111, represents the second capacitor electrode.

The conventional absolute capacitive micro pressure sensor configurations shown in FIGS. 1A & 1B are subject to several limitations or drawbacks. Electronic circuitry such as an integrated circuit is used to measure the capacitance of the pressure sensor or transducer representing a combination of two capacitances, that is, the capacitance to be measured CM (variable term) plus a stray capacitance CS (substantially constant term). Stray capacitance is an undesirable, but always present, capacitance that depends on the dielectric of the particular medium to which the deflectable membrane 111 is exposed in open cavity 114. The stray capacitance is produced between the pressure sensor element 150 and electronic circuitry 203 measuring the capacitance of the pressure transducer, as illustrated in FIG. 1C. The dielectric properties of the external medium or environment 213 impact the stray capacitance. The value of the stray capacitance is substantially constant for a particular medium so long as its dielectric properties remain substantially unchanged; however, the value of the substantially constant stray capacitance varies depending on the medium. Preferably, the stray capacitance contribution is calibrated at the time of manufacture. Dry sensor calibration (e.g., when the open cavity 114 is exposed to air) at the time of manufacture is easier to implement and thus preferred over wet sensor calibration (e.g., when the open cavity 114 is exposed to a fluid). Thus, it is desirable to perform a dry calibration of the pressure sensor at the time of manufacture even though the sensor is subsequently used in a different medium (e.g., saline in the case of the sensor being implanted in the body). To achieve this goal, the stray capacitance for the two different medium (e.g., air and saline) is reduced to be negligible, if not zero, by applying a gel in the open cavity in contact with an exposed surface of the deflectable membrane.

Another disadvantage associated with stray capacitance is the deleterious impact on overall sensitivity of the pressure sensor readings or measurements. As mentioned in the preceding paragraph, the capacitance measured by the pressure sensor electronic circuitry represents the combination of CM and CS. The greater the CS, the lower the sensitivity of the CM. By way of a first illustrative example, in an ideal scenario CS=0. If the CM ranges from approximately 5 pF to approximately 15 pF over the pressure range, then a capacitance change of approximately 1 pF corresponds to approximately 6.7% of the maximum capacitance the electronics has to measure (maximum CM of approximately 15 pF+CS (0)=approximately 15 pF). In a second example, CS is approximately 10 pF, while the CM still ranges from approximately 5 pF to approximately 15 pF over the pressure range. A capacitance change of approximately 1 pF corresponds to approximately 4% of the maximum capacitance the electronics has to measure (maximum CM of approximately 15 pF+CS (10 pF)=approximately 25 pF). For greater CS values, the measurement sensitivity will be reduced further still. As a result, minimizing the stray capacitance CS optimizes the capacitance measurement sensitivity.

Yet another disadvantage arises from the deflectable membrane 111 of the absolute capacitive micro pressure sensor being in direct contact with a fluid over a prolonged period of time possibly altering its mechanical properties. Exposure of the membrane 111 to a fluid may result in etching thereby reducing the thickness of the membrane material. Such factors as the salinity and/or pH of the fluid effect the extent of etching. A reduction in the overall thickness of the deflectable membrane 111 will decrease the mechanical stiffness resulting in sensor drift. Growing or depositing of a film or layer (e.g., a protein layer) on the membrane 111 is also possible particularly when exposed to a fluid over an extended period of time. Etching of and/or growing a layer on the deflectable membrane 111 will undesirably alter its mechanical properties and thus result in sensor drift.

Still an additional limitation or drawback of the absolute capacitive micro pressure sensor configuration in FIGS. 1A & 1B is the reduced accuracy of the pressure measurements as a result of formation of air bubbles in the fluid. During manufacture, an opening 112 is drilled in the base plate 100. Sensor element 150 is substantially aligned with the opening 112 and bonded to the base plate 100. Due to the very small size of the opening 112 (typically in the range of approximately 0.5 mm-approximately 2.5 mm) in the base plate 100, an air bubble may form in the cavity 114 as the fluid enters through the opening 112 defined in the base plate 100. The size constraints of the opening 112 are such that the air bubble cannot easily evacuate from the open cavity 114. Changes in fluid pressure within the open cavity 114, in turn, cause the air bubble to compress/expand thereby damping the sensed pressure.

Initially after manufacture, the implantable pressure sensor is not exposed to any fluids. As soon as the sensor is exposed to a fluid (i.e., during fluidic priming prior to implantation or after implantation when exposed to bodily fluids), an air bubble may form as the fluid enters the open cavity 114. Over time (e.g., several days or weeks), the air bubble is slowly absorbed by the fluid. In the meantime, the presence of the air bubble damps the pressure signal.

It is therefore desirable to develop an improved absolute capacitive micro pressure sensor that eliminates or minimizes the aforementioned drawbacks associated with use of an absolute capacitive micro pressure sensor in an environment subject to a fluid such as when the sensor is implanted in the body.

SUMMARY OF THE INVENTION

The present invention is directed to an improved absolute capacitive micro pressure sensor that solves the aforementioned problems associated with conventional devices by minimizing stray capacitance, improving the sensitivity of pressure measurement readings, minimizing alteration of the mechanical properties of the pressure sensor membrane and minimizing formation of air bubbles in the open cavity between the base plate and deflectable membrane when the sensor is exposed to a fluid.

One aspect of the invention is directed to an absolute capacitive micro pressure sensor including a pressure sensor element with a mechanically fixed electrode and a deflectable pressure sensor membrane separated from the fixed electrode by a predetermined distance. A packaging defining a chamber is formed by a cover assembled to a base plate with an opening defined therein. The chamber is filed with a fluid and/or a gas at substantially constant pressure. Within the chamber, the pressure sensor element is mounted to the base plate to define an open cavity therebetween substantially aligned with the opening defined in the base plate. A gel is disposed in the open cavity in contact with an exposed surface of the deflectable pressure sensor membrane.

Another aspect of the invention relates to a method for manufacturing the absolute capacitive micro pressure sensor in accordance with the preceding paragraph. An opening is defined in the base plate. The pressure sensor element is mounted to the base plate so that the deflectable pressure sensor membrane is substantially aligned with the opening defined in the base plate. A gel is then deposited in contact with an exposed surface of the deflectable pressure sensor membrane though the opening defined in the base plate.

BRIEF DESCRIPTION OF THE DRAWING

The foregoing and other features of the present invention will be more readily apparent from the following detailed description and drawings of illustrative embodiments of the invention wherein like reference numbers refer to similar elements throughout the several views and in which:

FIG. 1C is an exemplary schematic drawing representing the stray capacitance for the absolute capacitive micro pressure sensor of FIG. 1A encapsulated in a chamber.

DETAILED DESCRIPTION OF THE INVENTION

Figure 1A:
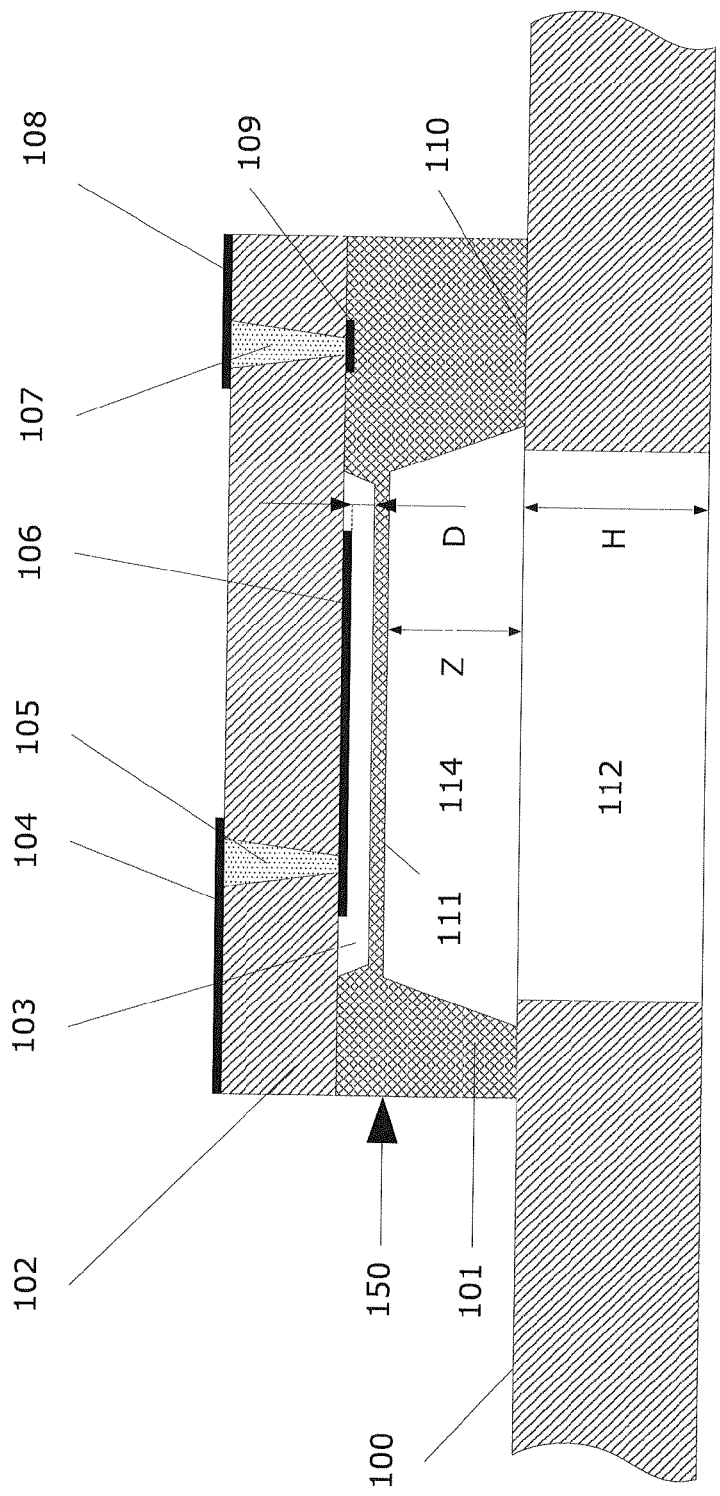
FIG. 1A is a cross-sectional view of a prior art absolute capacitive micro pressure sensor mounted to a base plate, wherein the deflectable membrane is made of a conductive material.
Figure 1B:
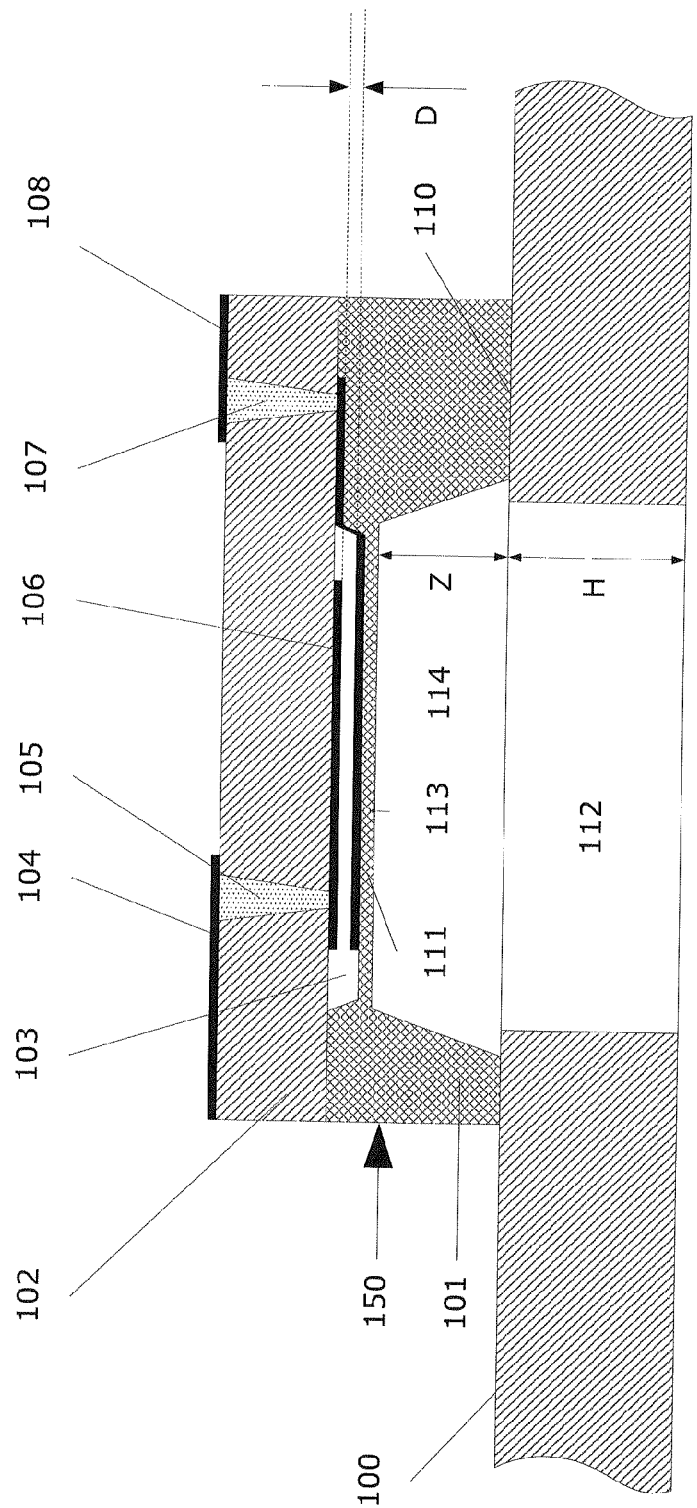
FIG. 1B is a cross-sectional view of a prior art absolute capacitive micro pressure sensor mounted to a base plate, wherein a separate second moveable capacitive electrode is mounted to a semiconductor deflectable membrane.
Figure 2A:
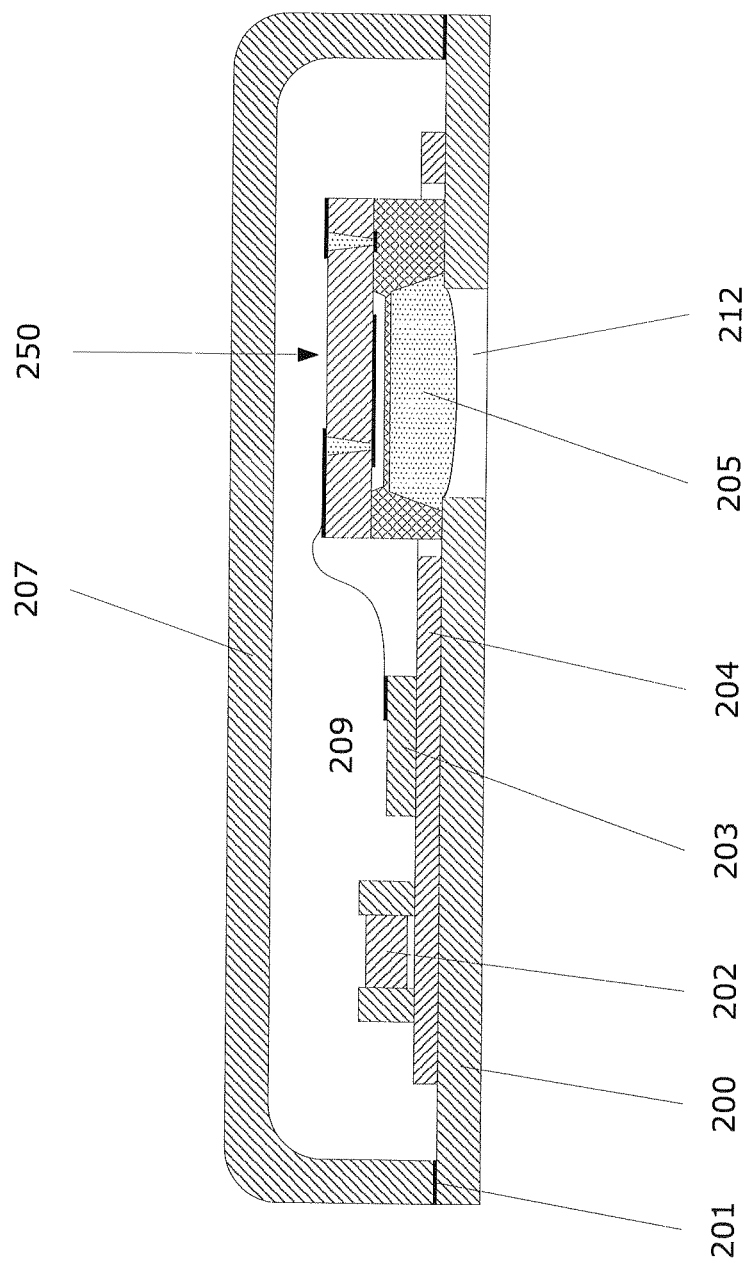
FIG. 2A is an exemplary cross-sectional view of an encapsulated absolute capacitive micro pressure sensor in accordance with the present invention wherein a gel is applied to the deflectable membrane.

An exemplary cross-sectional view of an encapsulated absolute capacitive micro pressure sensor in accordance with the present invention is shown in FIG. 2A. A pressure sensor element 250 is disposed in a chamber 209 formed by a hermetic enclosure, capsule or packaging including a cover 207 and base plate 200, both of which are preferably made of glass. By way of illustrative purposes only, the pressure sensor element 250 shown in FIG. 2A is identical to that shown in the embodiment depicted in FIG. 1A wherein the deflectable membrane is made of a conductive material (e.g., doped p+ silicon) and serves as the second moveable capacitive electrode. Accordingly, the reference element numbers and accompanying description for the pressure sensor element components depicted in FIGS. 2A-2E are not provided. It is contemplated and within the intended scope of the present invention that the alternative pressure sensor element embodiment depicted in FIG. 1B may be substituted for pressure sensor element 250 in FIGS. 2A-2D.

Chamber 209 is filled with a gas or fluid at a substantially constant. pressure. In a preferred embodiment chamber 209 is filled with an inert gas such as helium or argon in order to prevent or minimize oxidation/aging of the electronics (such as passive electronic components 202 and additional electronic components (e.g., an integrated circuit) 203, both of which are mounted on a printed circuit board 204). Another factor in the selection of the gas or fluid for filling chamber 209, is that it preferably be compliant with a leak tester used for testing the implant hermeticity after encapsulation. During leakage testing, the capsule is put in a hermetically sealed helium chamber subject to a substantially constant pressure preferably in the range of approximately 1.00 mbar—approximately 1000 mbar to detect any helium molecules escaping or leaking from the capsule. An opening or hole 212, preferably in the size range of approximately 0.5 mm—approximately 2.5 mm, is defined in the base plate 200. Sensor element 250 is mounted, preferably anodically bonded, to the base plate 200 so that the deflectable membrane 111 is substantially aligned with the opening 212 in the base plate 200. In a preferred embodiment, a metalized layer (e.g., Ti—Au layer) is disposed on respective mating surfaces of the cover 207 and base plate 200. A braze ring (e.g., a SnInAg layer) disposed between the metalized cover and the metalized base plate is melted to form a braze seal. A gel coating, layer or film 205 is in contact with the deflectable membrane. The gel coating, layer or film 205 may be a single layer or multiple layers.

Figure 2B:
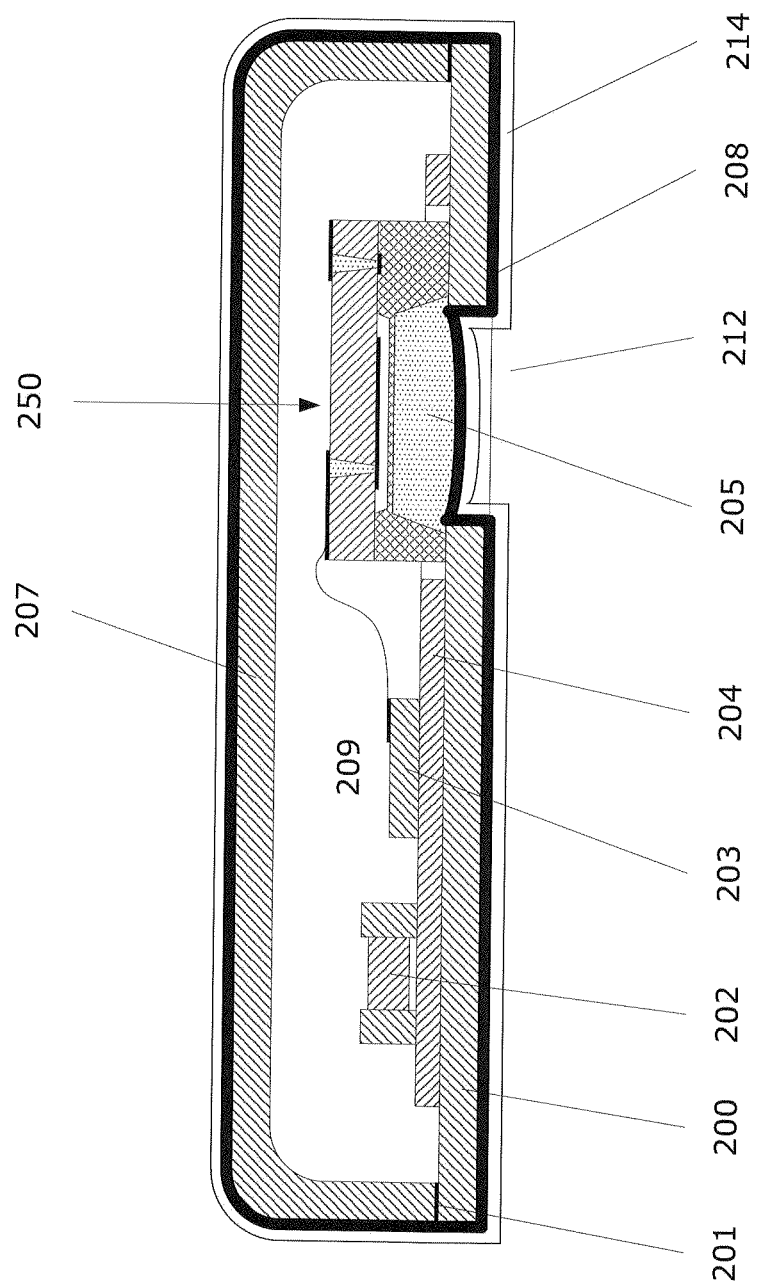
FIG. 2B is an exemplary cross-sectional view of the encapsulated absolute capacitive micro pressure sensor of FIG. 2A, wherein the glass packaging itself is covered by a biocompatible material.
Figure 2C:
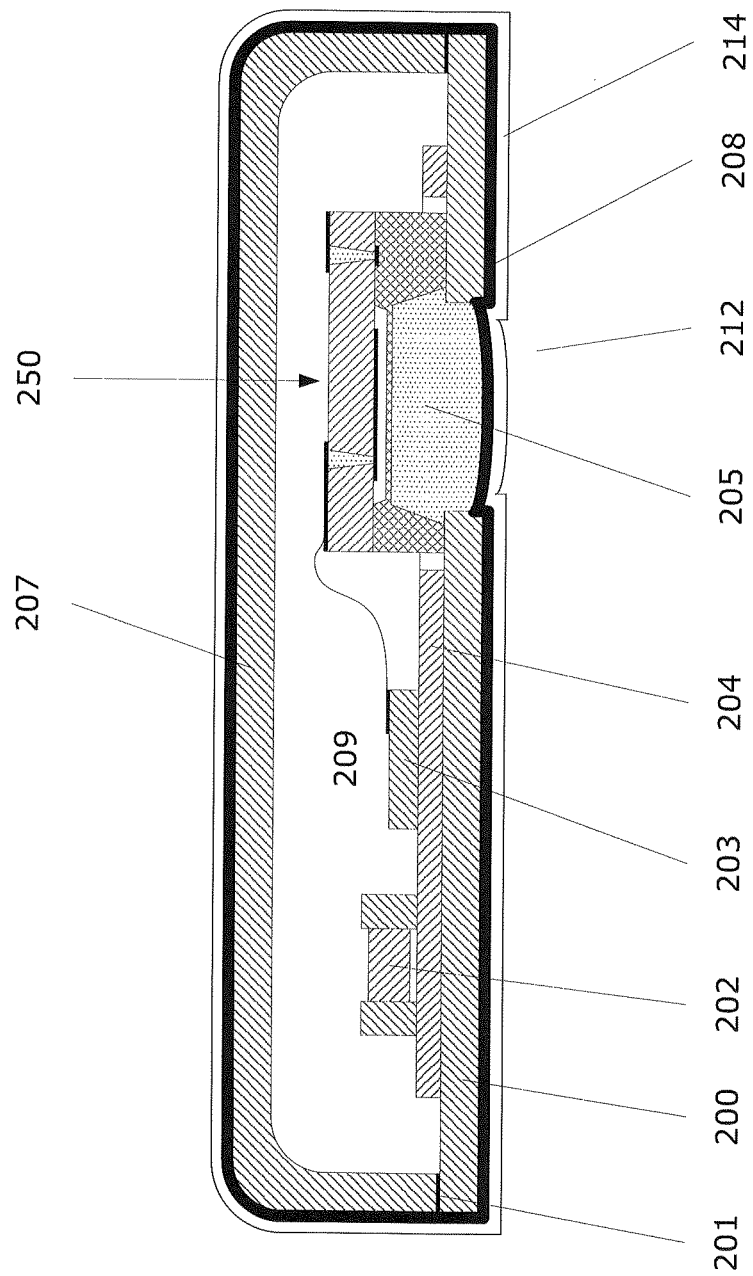
FIG. 2C is another exemplary cross-sectional view of an encapsulated absolute capacitive micro pressure sensor in accordance with the present invention, wherein the gel applied to the deflectable membrane extends further into the opening defined in the base plate while the glass packaging itself is covered by a biocompatible material.
Figure 2D:
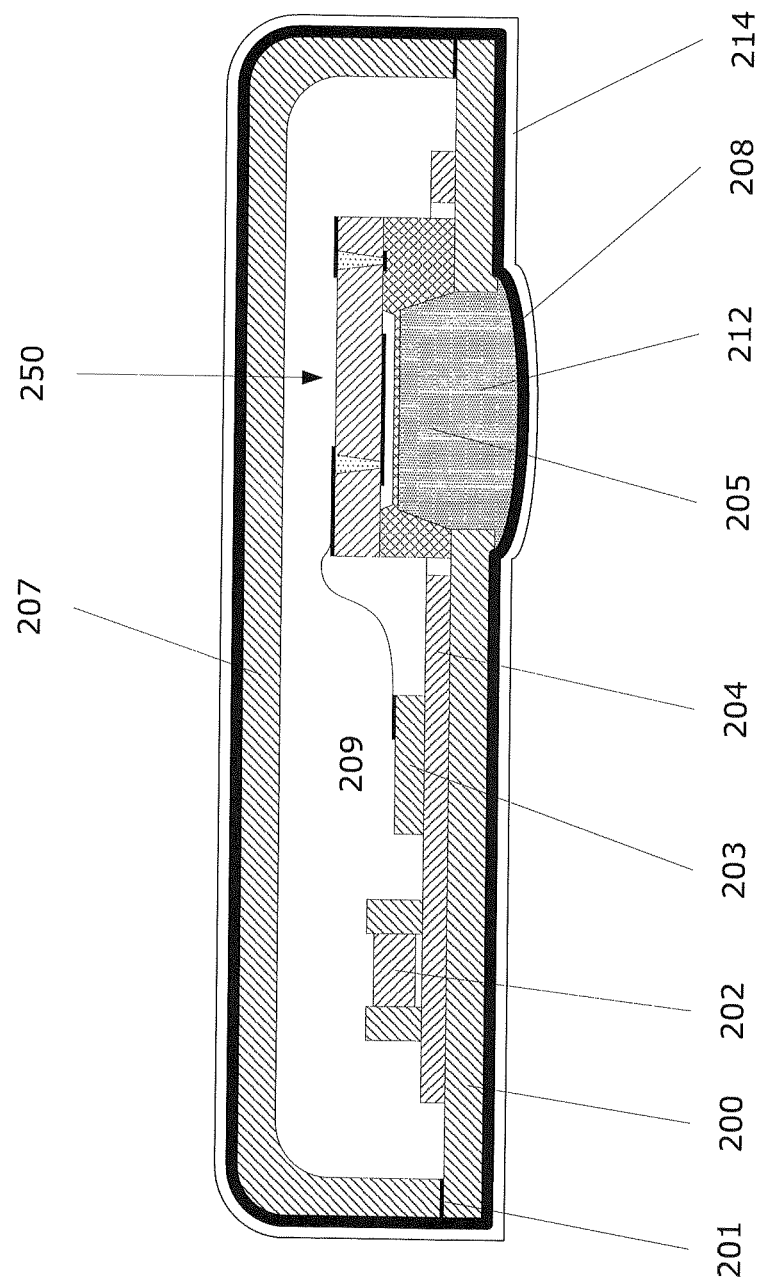
FIG. 2D is yet another exemplary cross-sectional view of an encapsulated absolute capacitive micro pressure sensor in accordance with the present invention, wherein the gel applied to the deflectable membrane extends beyond an exterior surface of the base plate, while the glass packaging itself is covered by a biocompatible material.
Figure 3:
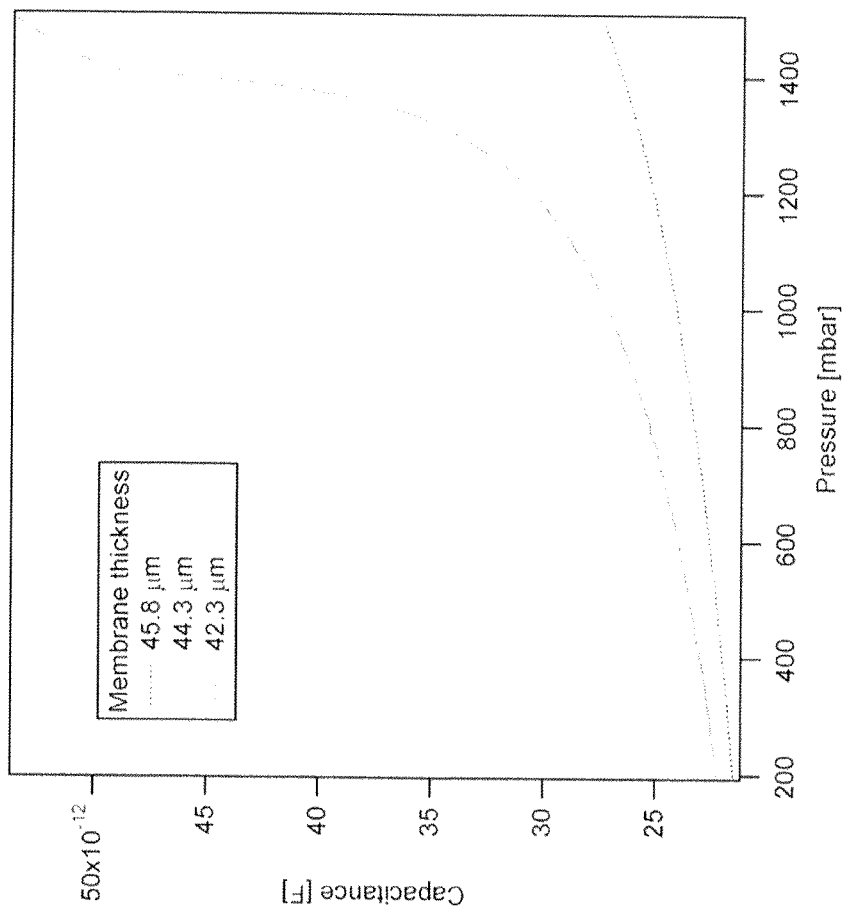
FIG. 3 is a graphical representation of capacitance as a function of pressure and thickness of the deflectable membrane of a conventional monocrystalline silicon absolute capacitive pressure sensor for three exemplary thicknesses of the deflectable membrane (45.8 um, 44.3 um, 42.3 um) depicted by the dotted, dashed and solid lines, respectively.

During manufacture, the gel 205 is forced, preferably under pressure, through the opening 212 in the base plate 200 into the open cavity and onto the exposed surface of the deflectable membrane 111. The quantity of gel to be applied is dependent on two opposing factors. On the one hand, a sufficient amount of gel is used to prevent or minimize stray capacitance, improve sensitivity of pressure measurement readings, minimize alteration in the mechanical properties of the deflectable membrane and minimize the formation of air bubbles in the fluid in the open cavity. Assuming negligible, if any, air bubbles are present in the gel then the mechanical compliance is substantially zero and the gel will be subject to negligible, if any, compressibility. Another factor to be taken into consideration is the viscosity of the gel. The viscosity of the gel selected if too large will undesirably impose a pressure-time delay response on the detection of transient pressure peaks. Therefore, the gel should be selected having a viscosity that minimizes any negative interference in transient or abrupt changes in pressure that otherwise may result in pressure drift readings. In a preferred embodiment, what is intended and contemplated in accordance with the present invention is for the gel to form a relatively thin barrier, film or layer in contact with the deflectable membrane 111 to accomplish the aforementioned intended results without effecting the operation of the pressure sensor. A distance Z (FIG. 1A) represents that distance between the deflectable membrane 111 and the base plate 200 (not including the base plate), whereas H represents the thickness of the base plate 200 itself. In as preferred embodiment, the thickness of the gel is in a range between approximately Z and approximately (Z+H). It is also contemplated and within the intended scope of the present invention for the gel to have a thickness less than Z or greater than (Z+H). A few illustrative, but not exhaustive, examples are depicted in the figures wherein the gel 205 extends just into the opening 212 (FIG. 2B), further into the opening 212 (FIG. 2C) and beyond the exterior surface of the base plate 200 (FIG. 2D).

Once injected into the open cavity, thereafter, the gel 205 may be cured. Preferably the gel applied to the deflectable membrane 111 is free or substantially free of bubbles that otherwise may present a weakness in the barrier resulting in undesirable stray capacitance. The gel is preferably deposited by means of a conventional potting procedure. A syringe having a nozzle complementary in geometry to that of the opening 212 defined in the base plate 200 is employed. The gel is expelled from the syringe by a piston preferably at ambient temperature. While the gel is being dispensed, the nozzle is moved upwards away from the deflectable membrane 211 at a rate sufficient to minimize the occurrence of air bubbles forming in the gel layer. Piston speed and pressure are also adjustable to minimize micro-bubble formation within the gel during potting.

When the present inventive absolute capacitive micro pressure sensor is implanted in the body, the gel prevents or minimizes the deflectable membrane 111 from being exposed to the presence of saline in the body having a relatively high dielectric constant that otherwise would cause a stray capacitance. In such a situation, the gel is preferably biocompatible, most preferably a biocompatible polymer such as silicon. The fluid, however, will unfortunately diffuse into the gel causing it to swell and induce mechanical stress on the deflectable membrane resulting in drift. To minimize or substantially prevent such diffusion, an additional deflectable protective coating, film or layer 208, preferably a biocompatible material such as a polymer (e.g. parylene), may be applied to the exposed surface of the gel 205. To insure that the gel 205 serves as a pressure transfer media between the deflectable protective coating 208 and the deflectable membrane 111, the stiffness of the deflectable protective coating, film or layer 208 is preferably substantially equal to, but more preferably less than, that of the deflectable membrane 111. The thickness of the deflectable protective coating is on the one hand sufficient to minimize or substantially prevent absorption by the gel, while on the other hand the deflectable protective coating is sufficiently thin so that it does not negatively impact on operation of the pressure sensor element. In a preferred embodiment, the thickness of the deflectable protective coating is between approximately 1 um—approximately 30 um. FIGS. 2B-2D depict an exemplary biocompatible deflectable protective coating 208 such as a polymer (e.g., paralyene) covering not just the gel 205 but the entire packaging (e.g., cover 207 and base plate 200). The biocompatible deflectable protective coating, layer or film 208 may be deposited by any known mechanism such as thin film chemical vapor deposition (CVD), for example, U.S. patent application Ser. Nos. 12/854,298 entitled "ULTRATHIN MULTILAYER PACKAGING"; 12/854,304 entitled "PLASMA ENHANCED POLYMER ULTRA-THIN MULTI-LAYER PACKAGING"; and 12/854,320 entitled "PACKAGING WITH ACTIVE PROTECTION LAYER", each of which was filed on Aug. 11, 2010 and assigned to MEDOS INTERNATIONAL SARL, a Johnson & Johnson Co. (each application is herein incorporated by reference in their entirety) When applying the deflectable protective coating, layer or film 208 the formation of pin holes is to be avoided or minimized that otherwise would present an area subject to an increased risk of possible diffusion by the fluid. It should be noted that the biocompatible deflectable protective coating, layer or film 208 does not have to cover the entire packaging, but instead may be restricted to only protecting the exposed surface of the gel.

The parylene deflectable protective coating, film or layer 208 is mechanically fragile and may easily break. Therefore, it is preferred to deposit one or more additional mechanical protective coating, film or layers 214 on the deflectable protective coating, film or layer 208 to maximize its mechanical robustness and minimize any diffusion of the fluid into the gel 205. By way of illustration only, FIGS. 2B-2D show a single mechanical protective coating 214, however, more than one coating, layer or film is contemplated and within the intended scope of the present invention. The mechanical protective coating 214 is made from a material different than that of the deflectable protective coating 208. Mechanical protective coating 214 may he made of an organic or an inorganic layer. Exemplary inorganic layers include: indium tin oxide; silicon nitride; silicon dioxide; ceramics or metals. Whereas, exemplary organic layers include: polymers other than parylene. The deposition of parylene is highly conformal and produces films that are substantially pin-hole free. Due to its biocompatibility and excellent mechanical as well as chemical properties, parylene is a preferred material of choice for packaging applications. Furthermore, its relatively high thermal stability (melting point of approximately 280° C.) permits parylene coated devices to be sterilized (up to approximately 135° C.) using conventional techniques. Despite the advantages of being substantially pin-hole free and relatively highly conformal, parylene layers lack molecular density and thus are susceptible to scratches. Nevertheless, this shortcoming may be overcome by employing an additional higher-density protective layer to serve as a mechanical protective coating to the parylene layer. Such higher density layers are prone to forming pinholes during formation and hence not suitable to be used alone (directly on the gel). In such cases, the presence of a few pinholes in the higher density layers of the protective coating is not problematic provided that a substantially pin hole free parylene coating is applied directly to the gel. In the case of an organic layer mechanical protective coating 214, its thickness is preferably in the range from approximately 1 um to approximately 50 um, whereas if an inorganic layer is used its thickness is preferably in the range of approximately a few tens of nm to approximately a few hundreds of nm. Like the deflectable protective coating 208 that may be applied only to the exposed surface of the gel, the mechanical protective coating 214 may be applied only over that same portion of the deflectable protective coating 208 covering the exposed surface of the gel. However, the deflectable protective coating 208 and mechanical protective coating 214 may be applied beyond that portion coinciding with the exposed surface of the gel and could cover the entire perimeter of the packaging formed by cover 207 and base plate 200 (as depicted in FIGS. 2B-2D).

The present inventive absolute capacitive micro pressure sensor in accordance with the present invention is particularly well suited for implantation in the body and exposure to saline. Its inventive structural design advantageously (i) minimizes stray capacitance; (ii) improves sensitivity of pressure measurements or readings; (iii) minimizes alteration of the mechanical properties of the membrane; and (iv) minimizes bubble formation of the fluid in the open cavity. Other applications are contemplated and within the intended scope of the present invention wherein the absolute capacitive micro pressure sensor is used for non-medical purposes and subject to fluids other than saline.

Thus, while there have been shown, described, and pointed out fundamental novel features of the invention as applied to a preferred embodiment thereof, it will be understood that various omissions, substitutions, and changes in the form and details of the devices illustrated, and in their operation, may be made by those skilled in the art without departing from the spirit and scope of the invention. For example, it is expressly intended that all combinations of those elements and/or steps that perform substantially the same function, in substantially the same way, to achieve the same results be within the scope of the invention. Substitutions of elements from one described embodiment to another are also fully intended and contemplated. It is also to be understood that the drawings are not necessarily drawn to scale, but that they are merely conceptual in nature. It is the intention, therefore, to be limited only as indicated by the scope of the claims appended hereto.

Every issued patent, pending patent application, publication, journal article, book or any other reference cited herein is each incorporated by reference in their entirety.

What is claimed is:

1. An absolute capacitive micro pressure sensor comprising:
   a pressure sensor element comprising:
      a mechanically fixed capacitor electrode;
      a deflectable membrane separated from the fixed electrode by a predetermined distance;
   a packaging defining a chamber formed by a cover and a base plate with an opening defined in the base plate, the chamber being tiled with at least one of a fluid or a gas at substantially constant pressure; the pressure sensor element being mounted to the base plate to define an open cavity therebetween substantially aligned with the opening defined in the base plate; and
   a gel disposed in the open cavity in contact with an exposed surface of the deflectable membrane.

2. The absolute capacitive micro pressure sensor in accordance with claim 1, wherein the gel fills at least partially the open cavity.

3. The absolute capacitive micro pressure sensor in accordance with claim 2, wherein the gel extends beyond an exterior surface of the base plate.

4. The absolute capacitive micro pressure sensor in accordance with claim 2, wherein the gel has a viscosity that minimizes any negative interference in transient changes in pressure; a thickness of the gel is sufficient to minimize stray capacitance, improve sensitivity of pressure measurement readings, minimize alternation of mechanical properties of the deflectable membrane and minimize formation of air bubbles in a fluid entering the open cavity.

5. The absolute capacitive micro pressure sensor in accordance with claim 2, wherein the gel has a thickness in a range between Z and (Z+H), where Z represents a distance from the exposed surface of the deflectable membrane to the base plate, and H represents a thickness of the base plate itself.

6. The absolute capacitive micro pressure sensor in accordance with claim 1, wherein the deflectable membrane is made of a conductive material.

7. The absolute capacitive micro pressure sensor in accordance with claim 1, wherein the pressure sensor element further comprises a moveable capacitor electrode mounted to the deflectable membrane, the moveable capacitor electrode facing but separated from the fixed capacitor electrode by a predetermined distance.

8. The absolute capacitive micro pressure sensor in accordance with claim 1, wherein the opening in the base plate is in the range of approximately 0.5 mm-approximately 2.5 mm.

9. The absolute capacitive micro pressure sensor in accordance with claim 1, wherein the gel is made of a biocompatible material.

10. The absolute capacitive micro pressure sensor in accordance with claim 1, further comprising a biocompatible deflectable protective coating disposed on at least an exposed surface of the gel.

11. The absolute capacitive micro pressure sensor in accordance with claim 10, wherein the biocompatible deflectable protective coating has a thickness that does not negatively impact on operation of the pressure sensor element, yet is sufficient to minimize or substantially prevent absorption by the gel.

12. The absolute capacitive micro pressure sensor in accordance with claim 11, wherein the thickness of the biocompatible deflectable protective coating is between approximately 1 um—approximately 30 um.

13. The absolute capacitive micro pressure sensor in accordance with claim 10, wherein the biocompatible deflectable protective coating has a stiffness less than or equal to a stiffness of the deflectable membrane.

14. The absolute capacitive micro pressure sensor in accordance with claim 10, further comprising a mechanical protective coating on an exposed surface of the biocompatible deflectable protective coating, wherein the material for the mechanical protective coating and the biocompatible deflectable protective coating differ.

15. A method for manufacturing the absolute capacitive micro pressure sensor in accordance with claim 1, comprising the steps of:
defining a hole in the base plate;
mounting the pressure sensor element to the base plate so that the deflectable membrane is substantially aligned with the opening defined in the base plate; and
depositing the gel in contact with an exposed surface of the deflectable membrane though the opening defined in the base plate.

16. The method in accordance with claim 15, further comprising the step of exposing the implanted absolute capacitive micro pressure sensor to a fluid.

17. The method in accordance with claim 15, further comprising the steps of
implanting the absolute capacitive micro pressure sensor in a body of a patient; and
exposing the implanted absolute capacitive micro pressure sensor to saline present in the body of the patient.

18. The method in accordance with claim 15, wherein the depositing step occurs under pressure.

19. The method in accordance with claim 15, wherein a thickness of the deposited gel on the exposed surface of the deflectable membrane is between Z and (Z+H), where H represents a distance from the exposed surface of the deflectable membrane to the base plate, and Y represents a thickness of the base plate itself.

20. The method in accordance with claim 15, wherein the gel fills at least partially an open cavity formed between the pressure sensor element and the base plate.

21. The method in accordance with claim 20, wherein the gel extends beyond an exterior surface of the base plate.

22. The method in accordance with claim 20, wherein the gel has a viscosity that minimizes any negative interference in transient changes in pressure; a thickness of the gel is sufficient to minimize stray capacitance, improve sensitivity of pressure measurement readings, minimize alternation of mechanical properties of the deflectable membrane and minimize formation of an bubbles in a fluid entering the open cavity.

23. The method in accordance with claim 15, wherein the depositing step comprises using potting procedures.

24. The method in accordance with claim 23, further comprising minimizing occurrence of air bubbles forming in the gel by adjusting a speed of a piston and pressure during potting.

25. The method in accordance with 15, wherein the gel is dispensed from a syringe having a nozzle complementary in geometry to that of the opening defined in the base plate.

26. The method in accordance with claim 25, further comprising the step of dispensing the gel from the syringe at ambient temperature.

27. The method in accordance with claim 25, simultaneously while dispensing the gel from the syringe, further comprising the step of minimizing occurrence of air bubbles forming in the gel by moving the nozzle away from the deflectable membrane.

28. The method in accordance with claim 15, further comprising the step of applying a biocompatible deflectable protective coating to at least an exposed surface of the gel.

29. The method in accordance with claim 28, wherein the biocompatible deflectable protective coating has a thickness that does not negatively impact on operation of the pressure sensor element, yet is sufficient to minimize or substantially prevent absorption by the gel.

30. The method in accordance with claim 29, wherein the thickness of the biocompatible deflectable protective coating is between approximately 1 um—approximately 30 um.

31. The method in accordance with claim 28, wherein the biocompatible deflectable protective coating has a stiffness less than or equal to a stiffness of the deflectable membrane.

32. The method in accordance with claim 28, further comprising the step of applying a mechanical protective coating on at least an exposed surface of the biocompatible deflectable protective coating, wherein the material for the mechanical protective coating and the biocompatible deflectable protective coating differ.

33. The method in accordance with claim 15, wherein the deflectable pressure sensor membrane is made of a conductive material.

34. The method in accordance with claim 15, wherein the pressure sensor element includes a moveable electrode mounted to the deflectable pressure sensor membrane; the moveable electrode facing but separated from the fixed electrode by a predetermined distance.

35. The method in accordance with claim 15, further comprising the step of curing the gel.

36. The method in accordance with claim 15, further comprising the step of mounting the cover to the base plate to form a chamber enclosing the pressure sensor, the chamber being filled with a fluid and/or a gas at substantially constant pressure.

* * * * *